United States Patent [19]

Mehrotra

[11] 4,388,654
[45] Jun. 14, 1983

[54] VIDEO DISC PLAYER WITH SELECTIVELY ENABLED AUDIO SIGNAL EXPANDER CIRCUITRY

[75] Inventor: Gopi N. Mehrotra, Carmel, Ind.

[73] Assignee: RCA Corporation, New York, N.Y.

[21] Appl. No.: 244,665

[22] Filed: Mar. 17, 1981

[51] Int. Cl.³ .......................... H04N 5/76; H04B 1/64
[52] U.S. Cl. ...................................... 358/343; 369/60; 369/88
[58] Field of Search .................. 358/127, 128.5, 128.6, 358/342, 336, 335, 343, 341; 369/86, 88, 89, 90, 91, 92, 124, 134, 133, 174, 126, 60; 333/14; 179/1 GM, 1 VL; 360/18, 22, 25, 8

[56] References Cited

U.S. PATENT DOCUMENTS

| | | | |
|---|---|---|---|
| 2,052,110 | 8/1936 | Pfister | 179/100.1 |
| 3,631,365 | 12/1971 | Dolby | 333/14 |
| 3,732,371 | 5/1973 | Burwen | 179/1 |
| 3,969,756 | 7/1976 | Palmer et al. | 358/4 |
| 4,220,929 | 9/1980 | Talbot et al. | 330/136 |

FOREIGN PATENT DOCUMENTS 356714 5/1980 Austria.

Primary Examiner—Stuart N. Hecker
Assistant Examiner—Donald McElheny, Jr.
Attorney, Agent, or Firm—E. M. Whitacre; J. S. Tripoli; E. P. Herrmann

[57] ABSTRACT

A video disc player designed to play video disc records having either non compressed monophonic wide band audio signals or video disc records having compressed stereophonic limited band audio signals recorded thereon. The player includes expander circuitry which may be selectively operated as a time invariant amplifier in the absence of stereo audio signals and as an amplifier with a time varying transfer function for expanding the stereo signals. The expander circuit operating mode is controlled by a circuit which detects the presence of a second or stereo sound carrier in the signal recovered from the record being played. Concurrently with the amplifier being rendered time invariant during the playback of monophonic records, electronic filter circuitry is switched into the amplifier circuitry to reduce the monophonic audio bandwidth and effectively increase the resultant audio signal-to-noise ratio.

9 Claims, 3 Drawing Figures

VIDEO DISC PLAYER WITH SELECTIVELY ENABLED AUDIO SIGNAL EXPANDER CIRCUITRY

This invention relates to video disc player circuitry and in particular, circuitry for selectively enabling or disabling gain control circuitry operating on the recovered audio signals.

BACKGROUND OF THE INVENTION

Certain video disc records and player systems have been designed for storing and recovering television signals comprising composite video and accompanying sound signals. The sound signals are recorded in monophonic or one channel format. The monophonic audio signal is recorded with a relatively wide signal bandwidth with respect to signal noise considerations since typical television receiver audio circuits have limited bandwidth and tend to remove the high frequency noise. Subsequent players and record discs were designed to accommodate stereophonic sound signals. The stereophonic audio signals are recorded with a higher signal-to-noise ratio and a narrower noise bandwidth in contemplation of these signals being reproduced via high quality, wide band audio amplifiers separate from the television receiver. In order to provide backward compatibility of the later designed records with the former players, the stereophonic or stereo sound signals were matrixed onto two channels, such that the conventional left plus right (L+R) stereo signal is recorded on a first sound channel and the conventional left minus right (L−R) stereo signal is recorded on a second sound channel. The first sound channel in the stereo system is made substantially equivalent to the single sound channel in the monophonic system and therefore the stereo records are configured to be played on the monophonic player. In addition, the matrix (decoding) circuitry in the stereo player, for separating the left and right signals from the matrixed signals in the first and second sound channels, is designed to reproduce monophonic sound signals recovered from a monophonic video disc record by the stereo player.

In order to enhance sound quality further in the later stereo systems, the stereo components of the sound signals were compressed prior to recording, to preserve the effective dynamic range of the signal and to reduce noise content. The stereo video disc player therefore necessarily includes expander circuitry to restore the signal to normal form. The system remains backward compatible since compressed signals reproduced without expansion are not objectionable. However, expansion of the uncompressed monophonic signal, by the stereo player playing a monophonic video disc wherein no provision has been made for audio noise reduction, may result in objectionable sound quality.

SUMMARY OF THE INVENTION

The present invention detects the absence or presence of the second sound channel in the recovered signal for selectively enabling the expander circuitry to perform its intended function only when two channel audio signals are present and conditioning the expander to perform as a time invariant amplifier otherwise.

DETAILED DESCRIPTION OF THE INVENTION

The signal recorded on a video disc record having stereo sound is typically the linear sum of a number of signals from sound and video sources. For example, U.S. Pat. No. 4,220,929, Palmer et al., describes a system for recording two channels of sound signal along with video signal. The technique employed is to frequency modulate a first relatively low frequency sound carrier with audio signal from a first audio source (a first sound channel), frequency modulate a second relatively low frequency sound carrier with audio signal from a second audio source (a second sound channel), frequency modulate a relatively high frequency picture carrier with video signal from a video source, linearly sum the three FM carriers and record the summed signal on the disc. The monophonic discs and players differ in that they only include the lower one of the two sound carriers or channels. The carrier frequencies are chosen to accommodate the available recording bandwidth with little, if any, intermodulation or crosstalk.

Upon signal playback the summed signal recovered from the disc record is processed into its constituent parts simply by applying the signal to bandpass filters respectively designed to select out or pass each of the respective FM carriers which are then demodulated, and processed for application to a television receiver, etc.

The Palmer reference describes a video disc system wherein the signals from individual audio sources are segregated in their respective channels. However, it should be appreciated that the audio signals may be matrixed into (L+R) and (L−R) signals, similar to stereo FM broadcast signals, for modulating the respective carriers so that the (L+R) signal will be compatible with monophonic players. In the player, the matrixed signals are decoded by linearly summing and differencing the two signals to yield an L signal and an R signal, i.e.

$$(L+R)+(L-R)=2L \text{ and}$$

$$(L+R)-(L-R)=2R.$$

It is known that one may preserve the dynamic range of an electrical signal transmitted through a path or medium of relatively limited dynamic range by compressing the signal prior to transmission and then expanding the signal subsequent to transmission. Examples of audio noise reduction systems employing such a "companding" (i.e., compression-expansion) technique are U.S. Pat. No. 3,732,371 which issued May 8, 1973, to R. S. Burwen and U.S. Pat. No. 4,220,429 which issued to Talbot et al., Sept. 2, 1980.

It should be appreciated that these techniques may be applied with regard to the audio signals of a video disc system. In the present system each of the audio signals is compressed prior to being recorded and prior to being matrixed. Expansion of the audio signals in the player is therefore performed after stereo decoding.

Figure 1:
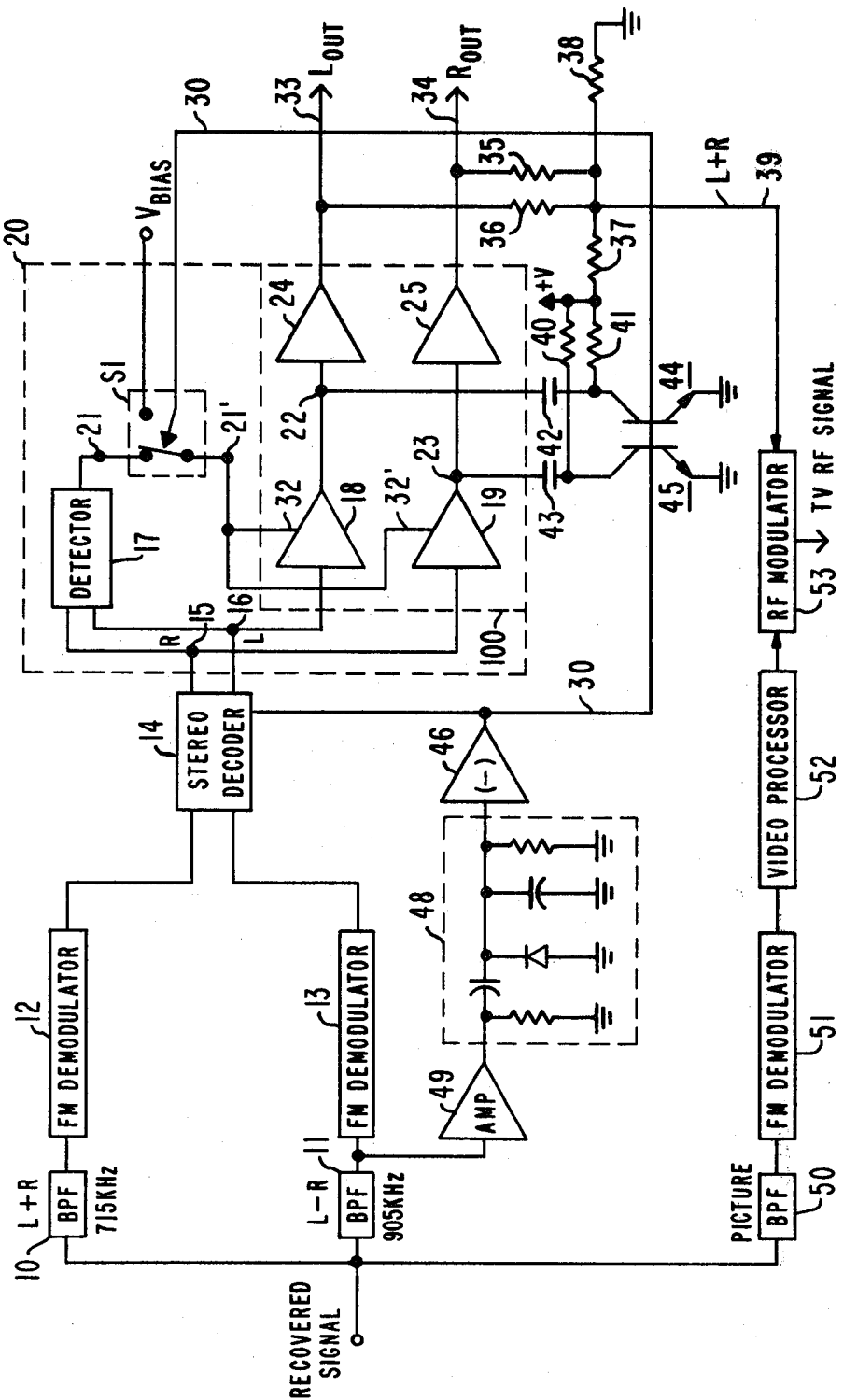
FIG. 1 is a partial schematic, partial block diagram of a portion of a video disc player processing circuitry embodying the present invention.

Referring now to FIG. 1, recovered signal from the video disc player pickup circuitry is applied at terminal 8. A first bandpass filter 10 selects out the lower FM sound carrier from the recovered signal and applies it to the FM demodulator 12. The output of demodulator 12 is the (L+R) matrixed signal. A second bandpass filter 11 selects the upper FM sound carrier from the recovered signal, which FM carrier is demodulated by FM demodulator 13 to produce the (L−R) audio signal. The matrixed demodulated audio signals are decoded in circuitry 14, producing the right (R) stereo audio signal, still compressed, at connection 15, and the left (L) stereo audio signal, still compressed at connection 16.

Decoder 14, responsive to a control signal on connection 30, will direct the (L+R) signal, i.e., the monophonic audio signal, derived from the demodulator 12 to both output connections 15 and 16 in the absence of the upper sound carrier from bandpass filter 11.

Figure 2:
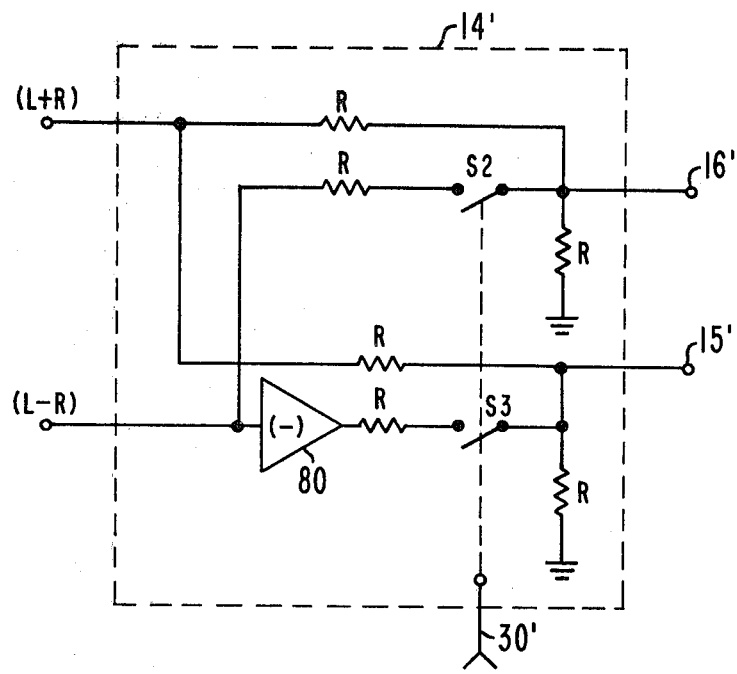
FIG. 2 is a circuit schematic of one variety of stereo decoder.

FIG. 2 illustrates a circuit means which can be utilized to realize the foregoing stereo decoder function. In FIG. 2 consider amplifier 80 to be a unity gain inverting amplifier and all of the resistors to be of equal resistance values. It can be shown that with switches S2 and S3 closed the decoder output signal at terminal 15' and 16' are respectively 2R/3 and 2L/3 and with switches S2 and S3 open, the decoder output signal at both terminals is (L+R)/2. It should be appreciated by one skilled in the circuit arts that the amplitude of the output signals with the switches in the open or closed position can be equalized simply by using switches having other poles to switch in additional shunting resistance when the (L−R) channel is disconnected.

The L and R signals are uncompressed or expanded by the expander circuit 20 which reconditions the audio signals to their substantially prerecorded form $L_{out}$ and $R_{out}$ at connections 33 and 34 respectively. Note that a portion of the signals $L_{out}$ and $R_{out}$ are summed by resistors 35, 36, 37 and 38 to produce an uncompressed (L+R) signal on connection 39 for use by monophonic television receivers.

A third bandpass filter 50 selects the FM picture carrier from the recovered signal. The picture carrier is demodulated by FM demodulator 51 with the resulting video signal being applied to video processing circuitry 52. Circuitry 52 conditions the video signal to standard format, e.g., NTSC, and applies the signal to RF modulator 53. In modulator 53 an RF carrier is modulated by the video signal and the L+R audio signal for application to the antenna terminals of a standard television receiver.

The expander circuit 20 comprises a detector 17 and variable gain amplifiers 18, 19. The detector 17 generates a time varying gain control signal related to the L and R compressed audio signals. The gain control signal at connection 21 is applied to gain control input terminals 32 and 32' of gain controlled amplifiers 18, and 19 respectively. The compressed L and R signals are applied respectively to the signal input terminals of amplifiers 18 and 19. The respective amplitudes of the compressed signals are multiplied in amplifiers 18 and 19 by a time varying coefficient proportional to the signal applied to the gain contol terminals to expand the signals according to the relative amplitude of the compressed signals. Output signal from gain control amplifier 18 is buffered by buffer amplifier 24 and the output signal from gain control amplifier 19 is buffered by buffer amplifier 25. Circuitry 100, including gain control amplifier 18 and 19 and buffer amplifier 24 and 25 may be realized by a single integrated circuit such as the National Semiconductor LM13600.

Detector 20 has a first input terminal connected to receive the compressed R audio signal at connection 15 and a second input terminal connected to receive the compressed L audio signal at connection 16. Detector 20 respectively rectifies the L and R audio signals to produce therein the respective time varying envelopes of the amplitudes of the respective signals. Note the rectifiers may be of the average, peak or RMS responding type, all of which are well known. The respective envelope having the larger amplitude is selected within the detector, then filtered and produced as an output signal from the detector at connection 21. This filtered time varying envelope is applied to the gain control input terminals of amplifiers 18 and 19 and produces a time varying transfer function in the amplifier to expand the audio signals.

The gain control signal is applied to amplifiers 18 and 19 through the single pole-double throw switch S1. Switch S1 controlled by a control signal on connection 30 selectively applies either the time varying gain control signal from the output terminal of detector 17 or a time invariant bias signal, e.g., $V_{bias}$ to the amplifiers. With the time invariant bias signal applied to the gain control signals the amplifiers (18, 24) (and 19, 25) are conditioned to operate as fixed gain amplifiers with respect to the audio signals applied to their respective input terminals 16 and 15.

The control signal at connection 30 is generated by the circuit comprising amplifiers 46 and 49 and detector 48. The amplifier 49 has its input terminal connected at the output terminal of the bandpass filter 11 and its output terminal connected to the input terminal of the detector 48. When the 905 KHz carrier is present, i.e., when a stereo record is being played the carrier is amplified in amplifier 49 and applied to detector 48. Circuit 48 diode clamps the waveform, then rectifies it to produce a positive DC output signal. The DC output signal is applied to the input terminal of inverting buffer amplifier 46 which produces an inverted signal at its output connection. The output potential of buffer amplifier 46 on connection 30 is therefore relatively negative when a 905 KHz FM signal is being recovered from a record and relatively positive when the 905 KHz FM signal is absent. Thus for the circuit shown, a relatively negative potential (control signal) on connection 30 closes switch S1 between terminals 21 and 21' to apply the time varying signal to circuitry 100 while a positive control signal closes switch S1 between $V_{bias}$ and terminal 21'.

Figure 3:
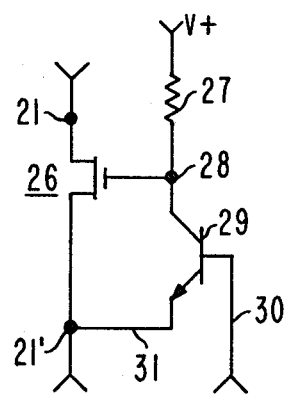
FIG. 3 is a schematic diagram of a circuit substitute for the single pole—double throw switch S2 in the FIG. 1 circuit.

FIG. 3 illustrates a schematic diagram of a circuit substitute for switch S1 where, for example, the gain control signal is a bias current as is required when circuitry 100 is realized with, e.g., LM13600 transconductance amplifiers. In FIG. 3, field effect transistor 26 is an N channel enhancement type device having a drain electrode connected at terminal 21, a source electrode connected at terminal 21' and a gate electrode connected at the circuit node 28. A resistor 27 is connected between a positive supply potential V+ and node 28. A bipolar transistor 29 has an emitter electrode connected to terminal 21', a collector electrode connected at node 28 and a base electrode connection 30.

A relatively negative potential on connection 30 conditions the collector-emitter circuit of transistor 29 to conduct no current. The potential at node 28 tends toward the V+ supply potential conditioning the drain-source channel of transistor 26 into hard conduction. This effectively completes or closes the circuit between terminals 21 and 21'. On the other hand a relatively positive potential applied to connection 30 conditions transistor 29 into conduction, creating a potential drop across resistor 27 such that there is insufficient potential applied to the gate electrode of transistor 26 to maintain transistor 26 in the on or conducting state thereby opening the circuit between terminals 21 and 21'. Note, however, that the emitter current of transistor 29 is applied to terminal 21' as a constant gain control signal. Typically, gain control amplifier circuits requiring current to bias the gain control input, e.g., the National LM 13600, will tend to clamp the potential at their gain control signal input terminals at $nV_{be}$ where n is an integer and $V_{be}$ is the forward potential drop of a diode or transistor base-emitter junction. The constant bias current supplied by the FIG. 3 circuit would under the foregoing condition be $(V^+ - nV_{be} - V_{sat})/R27$ where $V_{sat}$ is the collector-emitter saturation voltage of transistor 29 and R27 is the resistance value of resistor 27.

Referring again to FIG. 1, respective transistor 44 and 45 have their base electrodes connected for receiving control signal from connection 30 and respective emitter electrodes connected to reference potential. Capacitors 42 and 43 are respectively connected between the collector electrode of transistor 44 and amplifier interconnection 22 and the collector electrode of transistor 45 and amplifier interconnection 23. Responsive to a positive control signal on connection 30, transistors 45 and 44 provide low impedance conduction paths for coupling capacitors 43 and 42 to the reference potential and present high impedance conduction paths otherwise. The result is that the capacitors are selectively switched into the circuit in the absence of the 905 KHz carrier. The output impedance of the respective gain controlled amplifier (18, 19) coupled with the respective capacitance of the capacitors (42, 43) when switched into the circuit form low pass filters to limit the available bandwidth at interconnections 22 and 23 and therefore the bandwidth of the audio signal channels. This reduces the bandwidth of the amplifiers when monophonic audio signals, recorded with a relatively wide noise bandwidth, are to be reproduced by stereo playback components and effectively increases the signal-to-noise ratio of the monophonic audio signal.

What is claimed is:

1. In a video disc player of the type for recovering recorded signals including a first sound carrier modulated by a monophonic audio signal, and, when stereophonic signals are present modulated by the left plus right (L+R) audio signal, and, when stereophonic signals are present, including a second sound carrier modulated by the left minus right (L−R) audio signal and wherein the recorded stereophonic but not the monophonic modulating signals have been compressed during recording to effectively preserve dynamic signal range, said player including respective demodulating circuits for demodulating the sound carriers and stereophonic decoder circuitry responsive to the demodulated audio signals for producing at first and second decoder output terminals thereof respectively the left and right audio signals when stereophonic signal is recovered and producing monophonic signals at said first and second decoder output terminals when said first carrier is modulated by a monophonic audio signal, said player including expander circuitry responsive to the envelope of the audio signals at said first and second decoder output terminals for generating a time varying transfer function to restore said audio signals substantially to an uncompressed condition when stereophonic signals are recovered, said player further including means responsive to the absence of said second carrier for generating a control signal, and means responsive to said control signal for conditioning said expander circuitry to manifest a substantially time invariant transfer function during the absence of said second carrier.

2. The video disc player set forth in claim 1 further including means responsive to said control signal for reducing the maximum signal frequency passed by the expander circuitry in the absence of said second carrier and thereby increasing the apparent monophonic signal to noise ratio.

3. The video disc player set forth in claim 1 or 2 wherein the expander circuitry includes a first gain controlled amplifier for amplifying the audio signal at the first decoder output terminal, a second gain controlled amplifier for amplifying the audio signal at the second decoder output terminal, said first and second gain controlled amplifiers having respective gain control signal input terminals, said expander further including detector circuitry for generating a time varying gain control signal at an output terminal thereof said gain control signal being related to the envelope of the audio signals at said first and second decoder output terminals and wherein the means for conditioning said expander circuitry to manifest a substantially time invariant transfer function comprises:

a source of substantially time invariant gain control signal; and means responsive to said control signal for selectively applying said substantially time invariant gain control signal to said respective gain control input terminals in the absence of said second sound carrier and for applying the time varying gain control signal to said gain control input terminals otherwise.

4. The video disc player set forth in claim 2 wherein the expander circuitry includes first and second gain control amplifiers for respectively amplifying the audio signals from the decoder first and second output terminals, each of said first and second gain controlled amplifiers including a respective first gain controlled amplifier stage serially connected to a fixed gain amplifier stage and wherein the means for reducing the maximum frequency passed by the expander circuit comprises:

first and second capacitors having respective first plates connected respectively to the respective serial interconnection of the respective gain controlled and fixed gain amplifier stages; and first and second transistors responsive to said control signal and respectively connected to second plates of the first and second capacitors for selectively connecting the second plates of the capacitors to a point of reference potential in the absence of said second sound carrier.

5. A video disc player apparatus comprising: means for separating signal recovered from a disc record into first and second sound signals and a video signal, the first sound signal being a first carrier frequency modulated by one of a monophonic and a (L+R) stereophonic matrixed signal and the second sound signal being a second carrier frequency modulated by a (L−R) stereophonic matrixed signal;

respective means for demodulating the first and second sound signals to produce a (L+R) and a (L−R) audio signal;

decoder circuitry responsive to the (L+R) and (L−R) audio signals to produce the R audio signal at a first output terminal thereof, an L audio signal at a second output terminal thereof, and the (L+R) audio signal at both output terminals in the absence of said (L−R) audio signal;

expander circuitry responsive to a control signal for operatively expanding the audio signals from the first and second decoder output terminals with a time varying transfer function related to the amplitude of said audio signals for the control signal being in a first state and expanding the audio signals with a time invariant transfer function for the control signal being in a second state;

means responsive to the second carrier frequency for generating said control signal, the control signal being in the first state when the second carrier frequency is present in the recovered signal and in the second state otherwise.

6. The apparatus set forth in claim 5 further including circuit means including energy storing elements and means responsive to the control signal being in the second state for selectively connecting said circuit means into the expander circuitry to reduce the expander signal bandwidth.

7. The apparatus set forth in claim 5 wherein the decoder circuitry is conditioned to apply the (L+R) audio signal to both signal output terminals thereof responsive to the control signal being in said second state.

8. The apparatus set forth in claim 5 wherein the expander circuitry comprises:

detector circuitry responsive to the audio signals at the first and second decoder output terminals for generating at an output terminal thereof a time varying gain control signal related to the amplitude of the audio signal currently having the larger average amplitude;

a source of substantially constant bias signal;

first and second gain controlled amplifiers having respective signal input terminals connected to the first and second decoder output terminals, having respective output terminals at which the L audio signal and the R audio signals are respectively available, said gain controlled amplifier having respective gain control signal input terminals; and switch means responsive to the control signal for applying the constant bias signal to said gain control signal input terminals when the control signal is in said second state and for applying said time varying gain control signal to the gain control signal input terminals otherwise.

9. The apparatus set forth in claim 8 wherein the switch means comprises:

a first and second transistor, each having respective first and second electrodes and a principal conduction path therebetween, and having respective control electrodes, conduction in the principal conduction paths being controlled by the potential applied between the respective control and first electrodes, the first electrodes of said first and second transistors each being connected to the gain control signal input terminals of both gain control amplifiers, the respective second electrodes being connected to the output terminal of the detector circuit and the control electrode of the first transistor respectively and the control electrode of the second transistor adapted to receiving said control signal;

a resistor having a first end connected to the second electrode of said second transistor and having a second end; and means connecting said second end to a point of substantially constant potential.

* * * * *